US008922221B2

(12) United States Patent
Lacombe et al.

(10) Patent No.: US 8,922,221 B2
(45) Date of Patent: Dec. 30, 2014

(54) METHOD AND SYSTEM FOR DETECTING A SHORT CIRCUIT AFFECTING A SENSOR

(75) Inventors: Bertrand Lacombe, Paris (FR); Nicolas Geneste, Saint Fargeau (FR)

(73) Assignee: Sagem Defense Securite, Paris (FR)

( * ) Notice: Subject to any disclaimer, the term of this patent is extended or adjusted under 35 U.S.C. 154(b) by 0 days.

(21) Appl. No.: 14/009,718

(22) PCT Filed: Apr. 4, 2012

(86) PCT No.: PCT/FR2012/050727
§ 371 (c)(1),
(2), (4) Date: Jan. 17, 2014

(87) PCT Pub. No.: WO2012/136931
PCT Pub. Date: Oct. 11, 2012

(65) Prior Publication Data
US 2014/0145728 A1 May 29, 2014

(30) Foreign Application Priority Data

Apr. 5, 2011 (FR) ...................... 11 52936

(51) Int. Cl.
*G01R 31/14* (2006.01)
*G01R 31/02* (2006.01)
*G01R 31/28* (2006.01)
*G01R 27/14* (2006.01)

(52) U.S. Cl.
CPC .......... *G01R 31/025* (2013.01); *G01R 31/2829* (2013.01); *G01R 27/14* (2013.01)
USPC .. 324/509; 324/537; 324/750.03; 324/750.01

(58) Field of Classification Search
CPC .... G01R 31/02; G01R 31/024; G01R 31/025; G01R 31/2829

USPC .......... 324/509, 537, 750.01, 750.3, 548–549
See application file for complete search history.

(56) References Cited

U.S. PATENT DOCUMENTS 5,053,713 A 10/1991 Henoch
7,271,595 B2 * 9/2007 Shimizu et al. ............... 324/522
(Continued)

FOREIGN PATENT DOCUMENTS

| DE | 40 20 106 | 1/1992 |
| EP | 1 903 322 | 3/2008 |
| GB | 2 411 481 | 8/2005 |
| WO | 89 10542 | 11/1989 |

OTHER PUBLICATIONS

Written Opinion of the International Searching Authority issued Jul. 4, 2012 in PCT/FR2012/050727 filed Apr. 4, 2012, (5 pages).
International Search Report Issued Jul. 4, 2012 in PCT/FR12/050727 Filed Apr. 4, 2012.

*Primary Examiner* — Huy Q Phan
*Assistant Examiner* — Dustin Dickinson
(74) *Attorney, Agent, or Firm* — Oblon, Spivak, McClelland, Maier & Neustadt, L.L.P.

(57) ABSTRACT

A method of detecting a short circuit affecting a sensor, at least one terminal of the sensor being connected to a bias resistor, includes: applying to at least one bias resistor at least one test bias voltage having at least one predefined characteristic that is different from a corresponding characteristic of a nominal bias voltage of the resistor; measuring a resulting differential voltage across the terminals of the sensor; and as a function of at least one characteristic of the measured differential voltage corresponding to the predefined characteristic of the test bias voltages, determining whether the sensor presents a short circuit.

9 Claims, 4 Drawing Sheets

(56) References Cited

U.S. PATENT DOCUMENTS

| | | |
|---|---|---|
| 7,532,010 B2 * | 5/2009 | Kamel et al. .................. 324/503 |
| 7,701,224 B2 * | 4/2010 | Tsunekazu et al. ........... 324/543 |
| 2006/0036381 A1 | 2/2006 | Klein et al. |
| 2008/0074117 A1 | 3/2008 | Kamel et al. |
| 2012/0187969 A1 * | 7/2012 | Hess .......................... 324/750.3 |

* cited by examiner

METHOD AND SYSTEM FOR DETECTING A SHORT CIRCUIT AFFECTING A SENSOR

BACKGROUND OF THE INVENTION

The invention relates to the general field of sensors, such as for example sensors for sensing temperature, pressure, movement, etc.

The invention relates more particularly to detecting a short circuit affecting a sensor in an acquisition chain.

A preferred but non-limiting application of the invention thus lies in the field of aviation, in which numerous sensors are used (e.g. on board an aircraft).

In the prior art, there exist techniques for detecting that a simple resistive sensor is affected by a short circuit to a known potential, such as, for example, a short circuit to ground or to the power supply voltage. With that type of sensor, a short circuit to ground or to the power supply voltage gives rise to the resistance of the sensor being measured as zero.

An example implementation of such a technique is described in document US 2006/0036381. In that document, the presence of a short circuit affecting a resistive sensor is determined as a function of the ratio of the sum of the voltages at the terminals of the sensor to the power supply voltage of the sensor.

Such techniques make it possible advantageously to improve the measurements made using such simple resistive sensors, such as resistive temperature sensors in particular, thereby improving the reliability of such sensors.

Nevertheless, for sensors that are more complex, such as sensors having strain-gauge bridges, inductive sensors, or capacitive sensors, it is not possible to apply such detection techniques.

There therefore exists a need for a simple mechanism for detecting a short circuit affecting a sensor in an acquisition chain, which technique is suitable for being applied to a greater variety of sensors.

OBJECT AND SUMMARY OF THE INVENTION

The present invention satisfies this need by proposing a method of detecting a short circuit affecting a sensor, at least one terminal of the sensor being connected to a bias resistor, the method consisting in:
  applying to at least one bias resistor at least one test bias voltage having at least one predefined characteristic that is different from a corresponding characteristic of a nominal bias voltage of the resistor;
  measuring the resulting differential voltage across the terminals of the sensor; and
  as a function of at least one characteristic of the measured differential voltage corresponding to the predefined characteristic of the test bias voltages, determining whether the sensor presents a short circuit.

The invention makes it possible to detect a short circuit affecting a sensor by varying the bias voltages of the bias resistors conventionally connected to the sensor (which bias resistors are also known as "pull-up" resistors), e.g. by using a digital-to-analog converter that is controlled by a digital core of an electronic system.

This variation is performed by applying a test bias voltage to the bias resistor, which test bias voltage has at least one predefined characteristic that is different from a corresponding characteristic of the nominal bias voltage of the resistor. The term "nominal bias voltage" is used herein to mean the bias voltage that is usually applied to the bias resistor in order to guarantee "normal" operation of the sensor.

Various characteristics may be used to distinguish the test bias voltage that is applied to the bias resistor from its nominal voltage. Thus the nature of the applied signal may be different: for example the nominal bias voltage may correspond to a direct current (DC) signal while the test bias voltage includes an alternating current (AC) signal component at a predetermined frequency. In a variant, the test bias voltage may be distinguished from the nominal bias voltage by the values of some of their parameters, such as amplitude.

Thus, by injecting an appropriate test bias voltage to the bias resistors, the invention makes it possible to distinguish short circuit type failures of the sensor from other configurations that give rise to zero differential voltages at the terminals of the sensor. The invention thus advantageously makes it possible to detect a short circuit affecting various types of sensor, such as in particular resistive sensors and also sensors that are more complex such as inductive sensors (e.g. linear variable differential transformer (LVDT) sensors, resolvers, or phonic wheel sensors), capacitive sensors, strain-gauge bridge sensors, thermocouple sensors, etc.

In addition, it is possible to detect short circuits of different types, in particular short circuits to mechanical ground (and thus to an electric potential that may be unknown), and also short circuits that are referred to as "differential" short circuits (i.e. between two electric wires of the sensor).

More precisely, in a particular embodiment of the invention, it is determined that the sensor presents a short circuit if the characteristic of the measured differential voltage is different from a corresponding characteristic as expected for a differential voltage measured across the terminals of the sensor when the sensor does not present a short circuit.

It should be observed that the term "differential voltage across the terminals of the sensor" is used herein to mean the potential difference that exists between the two terminals of the sensor. For purposes of simplification, the same terminology is also used when one of the terminals of the sensor is connected to ground.

In a first variant embodiment of the invention:
  each terminal of the sensor is connected to a bias resistor;
  in order to apply the test bias voltage to each resistor, an AC signal at a predetermined frequency different from a working frequency of the sensor is applied to the two bias resistors; and
  it is determined that the sensor presents a short circuit if the resulting differential voltage includes an AC component at said predetermined frequency.

Advantageously, this first variant makes it possible to detect a short circuit to mechanical ground affecting the sensor under consideration. It requires only one measurement of the differential voltage, which measurement may be made for example by using the acquisition chain of the sensor. This first variant thus applies to sensors that are said to be "floating" relative to ground, i.e. in which common mode is not imposed by excitation or by some other device, and on which it is therefore possible to act.

In this first variant, the frequency in which the AC signal is issued may advantageously be determined as a function of the characteristics of the bias resistors and of the constraints of the acquisition chain, in particular so that it is possible for the differential voltage to be measured by the acquisition chain.

In a second variant of the invention, the method of detecting a short circuit also consists in measuring a nominal differential voltage across the terminals of the sensor when the bias resistors are fed with the nominal bias voltages. Furthermore, it is determined that the sensor presents a short circuit if the resulting differential voltage measured after applying the test bias voltages is substantially equal to the nominal differential voltage.

This second variant makes it possible to detect a short circuit of the differential type affecting the sensor.

In this second variant, in order to apply the test bias voltage, it is possible in particular to apply a DC signal to each resistor. By way of example, the DC signal may have an amplitude different from the amplitude of the nominal bias voltage of the resistor.

In order to apply the test bias voltage, it is also possible to apply an AC signal at a predetermined frequency different from a working frequency of the sensor to each resistor.

When each terminal of the sensor is connected to a bias resistor, the AC signals applied to the resistors may in particular be sinusoidal signals in phase opposition.

The use of sinusoidal AC signals in phase opposition presents an advantage of making a short circuit easier to detect.

The invention also provides a system for detecting a short circuit affecting a sensor, at least one terminal of the sensor being connected to a bias resistor, the system comprising:

means for applying, to at least one bias resistor, a test bias voltage having at least one predefined characteristic different from a corresponding characteristic of a nominal bias voltage of said resistor;

means for measuring the resulting differential voltage across the terminals of the sensor; and means for determining, as a function of at least one characteristic of the measured differential voltage corresponding to the predefined characteristic of the test bias voltages, whether the sensor presents a short circuit.

In a particular embodiment of the invention, the means for applying the test bias voltages comprise a digital-to-analog converter.

BRIEF DESCRIPTION OF THE DRAWINGS

Other characteristics and advantages of the present invention appear from the following description made with reference to the accompanying drawings that show embodiments having no limiting character. In the figures.

DETAILED DESCRIPTION OF AN EMBODIMENT

Figure 1:
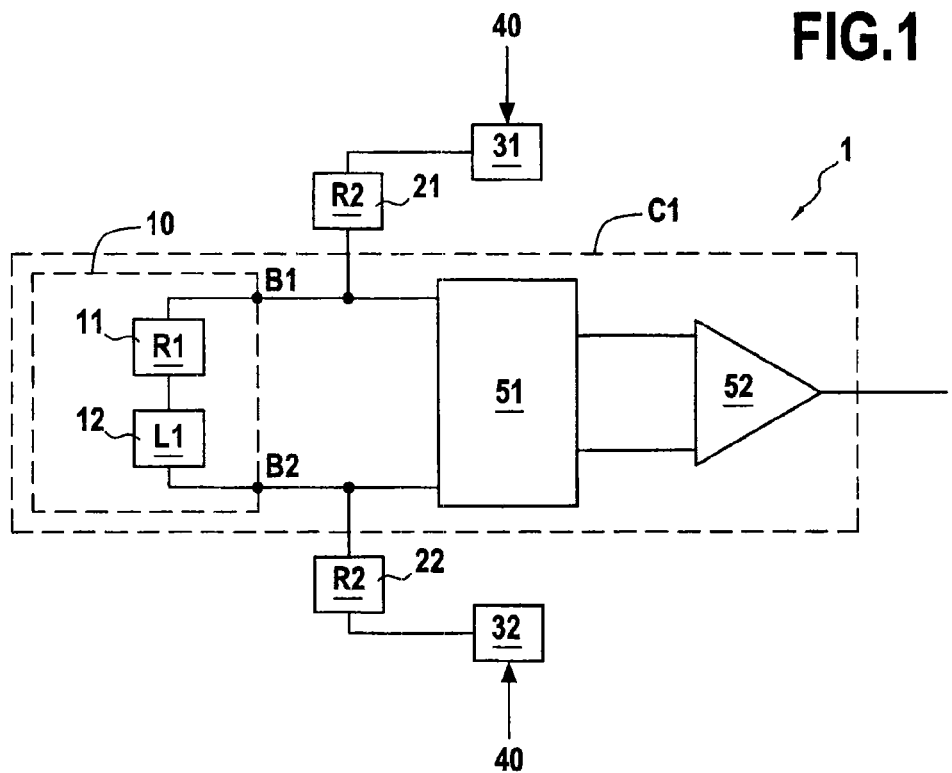
FIG. 1 shows a particular, differential-mode embodiment of a detection system in accordance with the invention, the system being shown in its environment.

FIG. 1 shows a particular embodiment of a short circuit detection system 1 in accordance with the invention, the system being shown in its environment.

In this embodiment, it is to be determined whether a short circuit is affecting a sensor 10 in a differential-mode acquisition chain C1. Nevertheless, the invention applies equally well to a common-mode acquisition chain, as described below with reference to FIG. 6.

By way of example, the sensor 10 is an inductive sensor for detecting position or movement, comprising at least one resistive element 11 characterized by its resistance R1, and an inductive element 12 characterized by its inductance L1. The values of R1 and L1 can be measured during a prior step of calibrating the sensor.

In the description below, the minimum values for R1 and L1 are written R1 min and L1 min. These values depend on the sensor in question and they are provided by the manufacturer.

Naturally, these assumptions are not limiting, it being equally possible for the sensor 10 to be a resistive sensor or a capacitive sensor, serving to measure other parameters, such as temperature, pressure, speed, etc.

The terminals B1 and B2 of the sensor 10 are connected respectively to two "bias" resistors 21 and 22, known to the person skilled in the art. The bias resistor 21 is connected to a high potential level and corresponds to a "pull-up" resistor, while the bias resistor 22 is connected to a low potential level and corresponds to a "pull-down" resistor.

In the presently-described example, the bias resistors 21 and 22 are identical, both having a resistance R2. In the description below, the minimum value of the resistance R2 is written R2 min. The term Vmax is used to designate the maximum bias voltage that may be applied to the bias resistors 21 and 22 without damaging the sensor 10. The values R2 min and Vmax depend on the bias resistors under consideration and on the sensor 10, and they are known to the manufacturer.

In a variant, it is possible to consider using bias resistors having distinct resistances and typical of withstanding different maximum and minimum bias voltages. Naturally, under such circumstances, the person skilled in the art knows how to adapt the calculations described below.

In the description below, it should be understood that for purposes of simplification the same notation is used both for designating an AC voltage and for designating a DC voltage, depending on circumstances.

The bias resistors 21 and 22 are connected to respective digital-to-analog converters 31 and 32 suitable for varying their respective bias voltages. The digital-to-analog converters 31 to 32 are themselves controlled by a digital core 40.

The acquisition chain C1 of the sensor 10 is also constituted, in known manner, by a common-mode or differential-mode filter 51 followed by an amplifier 52 serving to improve the signal-to-noise ratio of the measurement signal delivered by the sensor 10. The elements making up the acquisition chain and the principles on which they operate are known to the person skilled in the art and are not described in greater detail herein.

Figure 3:
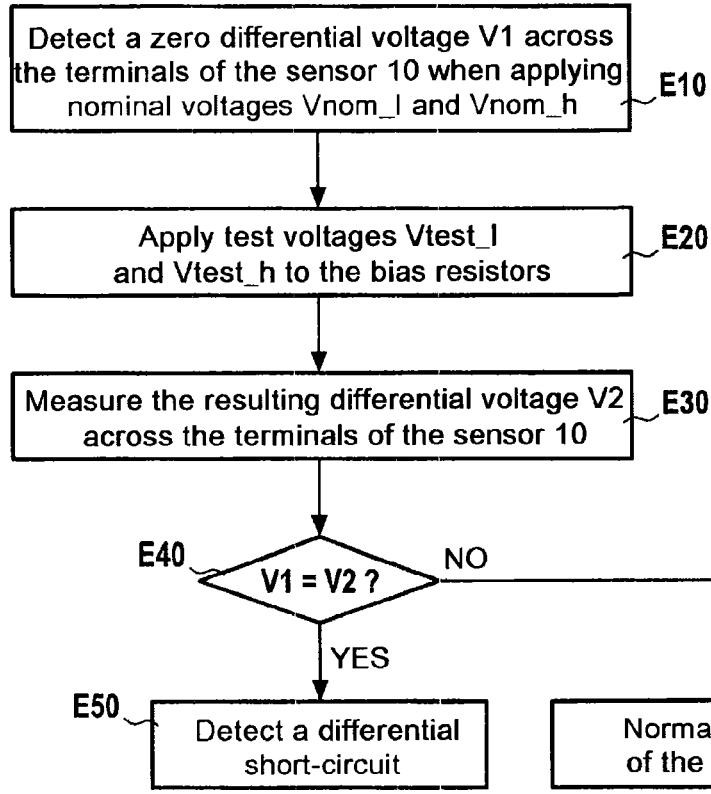
FIG. 3 shows the main steps of a method in accordance with the invention for detecting a short circuit when performed by the system shown in FIGS. 2A and 2B.
Figure 2A:
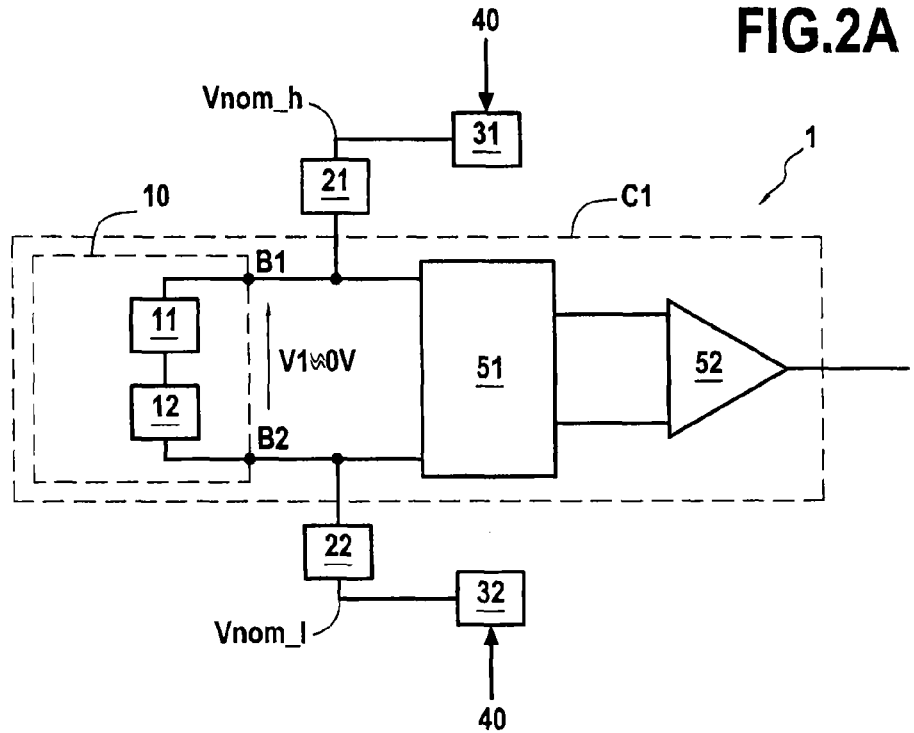
FIGS. 2A and 2B show an example application of the detection system shown in FIG. 1 to detecting a differential short circuit affecting a sensor.
Figure 2B:
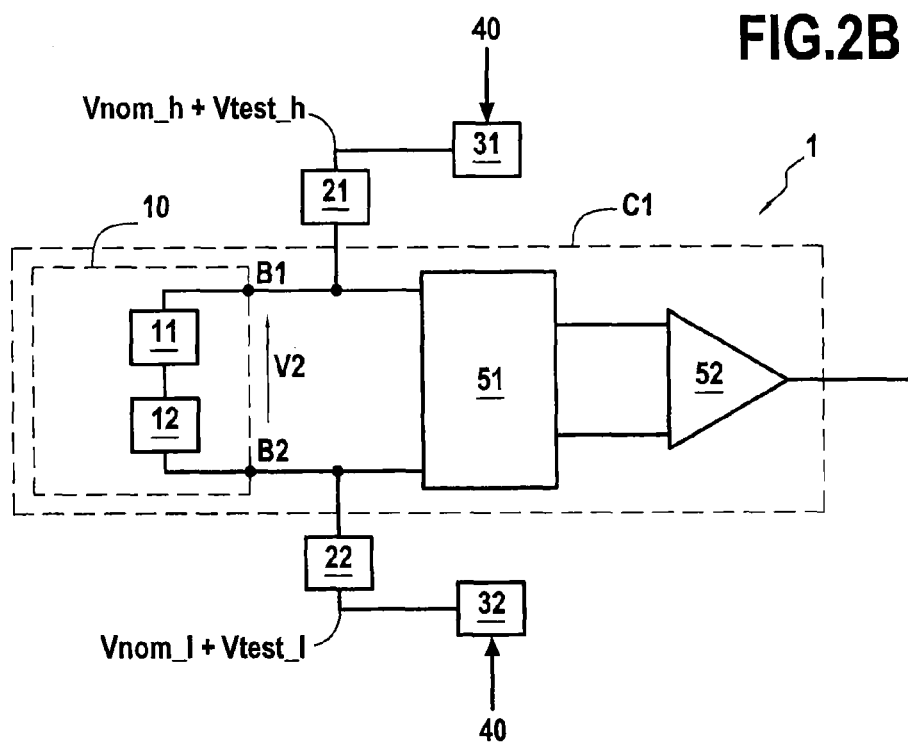

With reference to FIGS. 2A, 2B, and 3, there follows a description of a first example of utilization of the system 1 shown in FIG. 1 for the purpose of detecting whether a differential short circuit is affecting the sensor 10. The term "differential short circuit" is used herein to mean a short circuit that is present between two electric wires of the sensor.

With reference to FIG. 2A, it is assumed that a first measurement V1 of the differential voltage across the terminals of the inductive sensor 10 gives a value that is close to 0 volts (step E10), which first measurement is taken while the bias resistors 21 and 22 are respectively connected to nominal bias voltages Vnom_h and Vnom_l.

This first measurement V1 constitutes a nominal differential voltage in the meaning of the invention. The measurement is taken using the acquisition chain C1 of the system 1, in known manner that is not described herein.

The nominal voltages Vnom_h and Vnom_l are DC voltages. They are applied to the bias resistors 21 and 22 via the digital-to-analog converters 31 and 32 respectively, these converters being controlled by the digital core 40.

These nominal voltages represent the voltages that are usually applied at the terminals of the bias resistors for the purpose of guaranteeing normal operation of the sensor 10. In known manner, they depend on the characteristics of the sensor 10, and they are easily determined by the person skilled in the art.

After detecting a first differential measurement V1 of zero across the terminals of the sensor, respective test bias voltages Vtest_h and Vtest_l are applied to the terminals of the bias resistors 21 and 22 via the converters 31 and 32 (step E20). In accordance with the invention, the voltages Vtest_h and Vtest_l have at least one predefined characteristic that is different from a corresponding characteristic of the nominal voltages Vnom_h and Vnom_l.

The purpose of applying test bias voltages Vtest_h and Vtest_l to the bias resistors 21 and 22 is to make it possible to determine whether a short circuit exists across the terminals of the sensor 10 by taking a second measurement V2 of the resulting differential voltage across the terminals of the sensor. More precisely, in the presently-described example, if the above-mentioned predefined characteristic of the differential voltage V2 is different from the corresponding characteristic expected for a differential voltage measured across the terminals of the sensor 10 when it does not present a short circuit, then it is determined that the sensor 10 is affected by a short circuit.

In known manner, the bias resistors 21 and 22 are not intended, in principle, to disturb the operation of the sensor 10, including in the event of a change in one or more characteristics of their bias voltages. Furthermore, advantageously in the invention, in order to identify whether a differential short circuit exists, the test voltages Vtest_h and Vtest_l should be dimensioned in such a manner as to take advantage of a defect in the bias resistors 21 and 22.

Such a defect serves to obtain a second differential measurement V2 that is identical to the first differential measurement V1 when there exists a differential short circuit affecting the sensor 10, or a measurement V2 that is practically identical thereto (i.e. to within a threshold $\epsilon > 0$).

Conversely, if a difference is detected between the first differential measurement V1 and the second differential measurement V2, then that means that even though a zero value was measured for the differential voltage V1, the sensor 10 is behaving normally, i.e. it does not present a differential short circuit.

Two scenarios are envisaged for dimensioning the voltages Vtest_l and Vtest_h as a function of the value of the minimum DC impedance of the sensor 10, in other words R1 min.

Scenario 1: the DC impedance of the sensor 10 satisfies the following inequality:

$$R1\min \geq \frac{\frac{Vacq\_min}{Vmax} \times R2\min}{1 - \frac{Vacq\_min}{2 \times Vmax}} \quad (1)$$

in which Vacq_min designates the value of the minimum DC voltage that can be measured by the acquisition chain C1, and Vmax designates the maximum DC bias voltage that can be applied to the bias resistors 11 and 12. These values are predetermined and known.

In the first scenario, the DC impedance of the sensor 10 (i.e. R1 ) is sufficiently large to ensure that when DC signals of amplitudes greater than those of the nominal voltages Vnom_l and Vnom_h are applied as test bias voltages Vtest_l and Vtest_h, it is possible to use the acquisition chain C1 to detect a difference between the measurements V1 and V2 when the sensor 10 is behaving normally.

Thus, in this first scenario, the predefined characteristic of the test bias voltage that differs from the corresponding characteristic of the nominal bias voltage in the meaning of the invention is amplitude.

For the test bias voltage amplitudes, it is preferable to select amplitudes that are close to the maximum values Vmax for the bias voltages of the bias resistors 21 and 22 that can be withstood by the sensor 10 without being damaged or deteriorated.

The difference between the measurements V1 and V2 need not necessarily be very great in order to be representative of normal behavior of the sensor 10. Even a small difference suffices, providing it is greater than the minimum voltage Vacq_min that can be measured by the acquisition chain C1. In other words, given the inequality (1), if:

$$V2 - V1 > \frac{R1\min}{R1\min + 2R2\min} \times 2Vmax$$

then the sensor 10 is considered as having behavior that is normal.

By way of numerical example, for a strain-gauge type sensor, having an impedance R1 min of 2 kilohms (kΩ) and under the following assumptions:
    Vacq_min=20 millivolts (mV);
    R2 min=1 megohm (MΩ); and
    Vmax=20 volts (V)
a voltage difference (V2 −V1 ) that is greater than about 40 mV is representative of normal behavior of the sensor.

It should be observed that the difference V2 −V1 depends on the minimum impedance of the sensor and on the maximum impedance that is considered as being symptomatic of a short circuit.

By way of example, strain-gauge sensors, which generally present a DC impedance that is large relative to the impedances of the bias resistors normally used, come within this first scenario.

Scenario 2: when the DC impedance of the sensor 10 does not satisfy the inequality (1), it is not possible with DC signals for the test bias voltages Vtest_l and Vtest_h to use the acquisition chain C1 in order to detect even a small difference between the measurements V1 and V2 when the sensor 10 is behaving normally. By way of example, phonic wheels or resolver sensors generally come within this second scenario.

Under such circumstances, in order to apply the test bias voltages Vtest_l and Vtest_h, the nominal DC voltages Vnom_l and Vnom_h have sinusoidal AC voltage signals S1 and S1' superposed thereon in phase opposition and at a predetermined frequency $f_1$ that is different from the working frequency $f_0$ of the sensor 10. By way of example, the signals S1 and S1' may have the following form:

$$S1(f_1) = V\max \cos(2\pi f_1 t)$$

and $$S1'(f_1) = V\max \cos(2\pi f_1 t + \pi)$$

It may be observed that other types of signal may be superposed on the nominal voltages, such as for example square-wave signals or triangular-wave signals.

The term "working frequency" $f_0$ of the sensor is used herein to designate the frequency at which the sensor usually operates, which frequency is predefined and specified by the manufacturer of the sensor.

Thus, in this second scenario, the predefined characteristic of the test bias voltage that is different from the corresponding characteristic of the nominal bias voltage in the meaning of the invention is the nature of the signal, and more precisely its AC component.

The frequency $f_1$ is selected so as to obtain a minimum equivalent impedance Zleq of the sensor 10 that is sufficiently large to enable the acquisition chain C1 to detect a difference, even if small, between the measurements V1 and V2 while the sensor 10 is behaving normally. For this purpose, in this example, a frequency $f_1$ is selected that lies between the (predetermined) maximum frequency that is acceptable for the acquisition chain C1, written fmax, and a minimum frequency fmin that is calculated as follows:

$$f\min = \frac{1}{2\delta}\sqrt{\frac{\|Z1eq\|^2 - R1\min^2}{L1\min^2}} \quad (2)$$

where $$Z1eq = \frac{\frac{V\text{acq\_min}}{V\max} \times R2\min}{1 - \frac{V\text{acq\_min}}{2 \times V\max}} \quad (3)$$

the voltages under consideration in equations (2) and (3) being the amplitudes of AC voltages.

In a variant, it is possible to use the values R1 and L1 in equation (2) instead of the values R1min and L1min, in order to obtain a more accurate estimate for the frequency fmin. As mentioned above, these values may be determined during a step of calibrating the sensor 10, as is known to the person skilled in the art.

After respective voltages Vtest_h and Vtest_l have been applied to the bias resistors 21 and 22, the acquisition chain C1 is used to take a second measurement V2 of the resulting differential voltage across the terminals of the sensor 10 (step E30).

This second measurement V2 is then compared with the nominal first differential measurement V1, e.g. by the digital core (step E40).

If, during this comparison, it is determined that the nominal and resulting voltages V1 and V2 are substantially equal, in other words that they are zero or practically zero, it is then deduced that a differential short circuit is affecting the sensor 10 (step E50).

In other words, this means:
for sensors in the first above-envisaged scenario: that the measured amplitude of the differential voltage V2 is different from the amplitude expected across the terminals of the sensor in the absence of a short circuit (an amplitude different from the amplitude of V1 is to be expected during normal behavior of the sensor, i.e. in the absence of a short circuit); and
for sensors in the above-envisaged second scenario: that the differential voltage V2 does not include a component at the frequency $f_1$, unlike the differential voltage that ought to be measured across the terminals of the sensor if it were not affected by a short circuit.

Conversely, if during this comparison it is found that the nominal and resulting voltages V1 and V2 are not equal (to within a threshold $\epsilon$), it is then deduced that the sensor 10 is behaving normally when a differential voltage V1 is measured across its terminals, in other words that it is not affected by a differential short circuit (step E60).

In this first example utilization of the system 1, the inequalities (1), (2), and (3) are derived for a sensor that is inductive. Nevertheless, the invention is not limited to a sensor of this type, and is equally applicable to sensors that are resistive or capacitive.

It should also be observed that the inequalities (1), (2), and (3) are equally valid for a resistive sensor. The person skilled in the art will have no difficulty in adapting these inequalities for a capacitive sensor.

Figure 4:
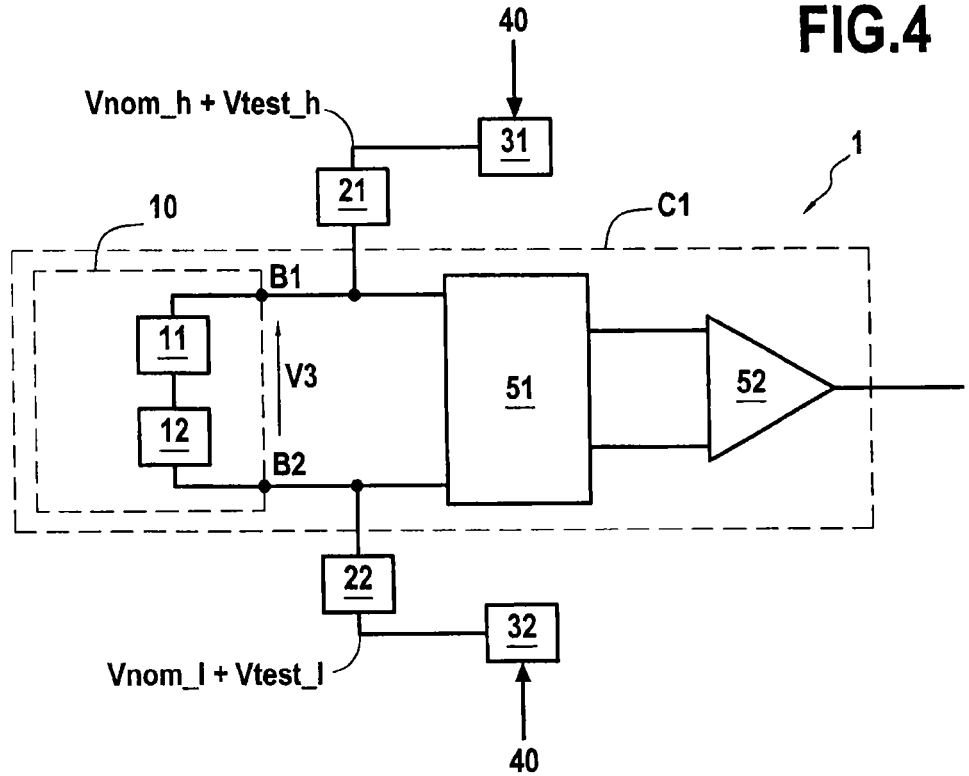
FIG. 4 shows an example application of the detection system shown in FIG. 1 for detecting a short circuit to mechanical ground affecting a sensor.
Figure 5:
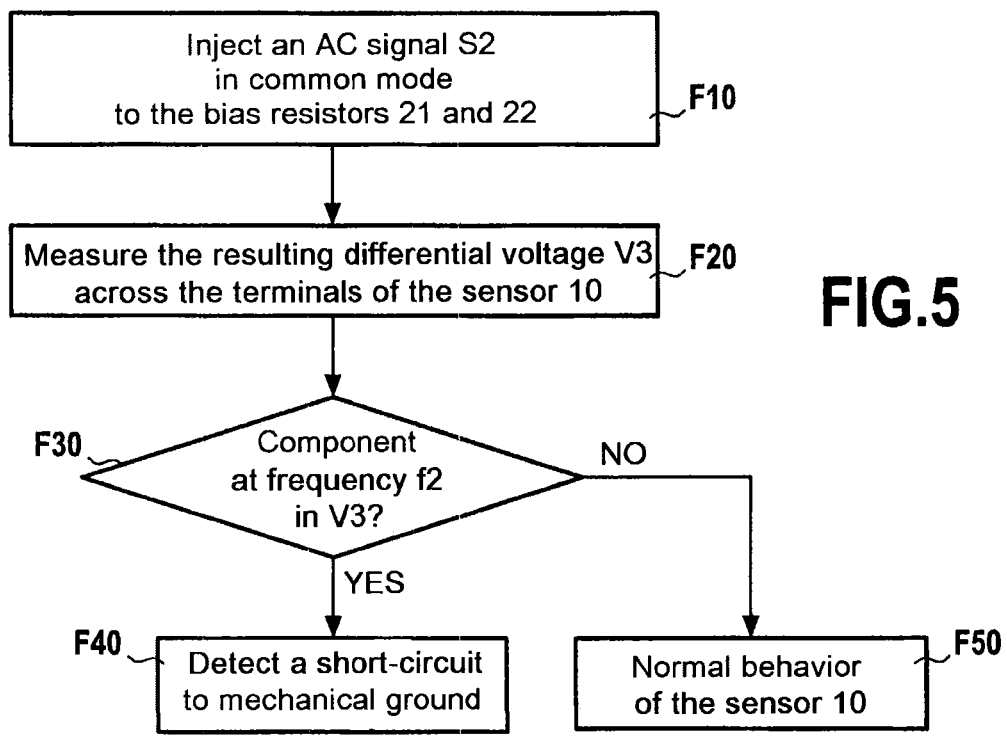
FIG. 5 shows the main steps of a method in accordance with the invention for detecting a short circuit when performed by the system shown in FIG. 4.

With reference to FIGS. 4 and 5, there follows a description of a second example of utilization of the system 1 shown in FIG. 1 for detecting whether a short circuit to mechanical ground is affecting the sensor 10. The term "short circuit to mechanical ground" is used herein to mean a short circuit affecting that one of the wires of the sensor 10 that is connected to an unknown potential, where the other wire is connected to ground.

For this purpose, a sinusoidal voltage signal S2 at a frequency $f_2$ is injected in common mode to the bias resistors 21 and 22 via the digital-to-analog converters 31 and 32 (step F10). By way of example, the signal S2 has the form:

$$S2(f_2) = V\max \cos(2\pi f_2 t)$$

In the presently-described example, this signal is superposed on the nominal bias voltages, such that:

$$V\text{test\_}h = V\text{nom\_}h + V\max \cos(2\pi f_2 t)$$

and $$V\text{test\_}l = V\text{nom\_}l + V\max \cos(2\pi f_2 t),$$

where Vnom_h and Vnom_l are the nominal bias voltages of the bias resistors 21 and 22 under steady conditions.

The frequency $f_2$ is selected so as to satisfy the following constraints:
the injected signal must not generate a disturbance in the signal at the working frequency $f_0$ of the sensor; and
in the event of a short circuit, it should be possible to observe a signal at a frequency other than the working frequency $f_0$ of the sensor 10, and this signal should be measurable using the acquisition chain C1.

More precisely, and as described above for the frequency $f_1$ in the first example application, the frequency $f_2$ is selected to be less than the maximum frequency fmax that is acceptable for the acquisition chain C1 and greater than the minimum frequency fmin as given by the above-defined equations (2) and (3).

Thus, in this example, the predefined characteristic of the test bias voltage that differs from the corresponding characteristic of the nominal bias voltage in the meaning of the invention is the nature of the signal, and more precisely its AC component if the voltages Vnom_h and Vnom_l are DC voltages.

It should also be observed that other types of signal may be superposed on the nominal voltages, such as for example square-wave signals or triangular-wave signals.

The resulting differential voltage V3 that results from applying the test bias voltages Vtest_h and Vtest_l to the bias resistors 21 and 22 is then measured using the acquisition chain C1 (step F20). Thereafter, the characteristics of this differential voltage V3 are observed (step F30).

It should be observed that for these steps, it is advantageous in this example to use the acquisition chain C1 of the sensor 10, thus making it possible to perform the invention in simple manner without requiring the use of additional equipment. Nevertheless, in a variant, it is also possible to envisage using an oscilloscope.

Since the test bias voltages Vtest_h and Vtest_l correspond to signals at the same frequency $f_2$ that are injected in common mode to the two bias resistors 21 and 22, if the sensor 10 is behaving normally it is to be expected that no signal will be observed at the frequency $f_2$ in the output from the sensor 10.

Thus, if a component at the frequency $f_2$ is observed in the voltage V3, it can then be deduced that a short circuit to mechanical ground is affecting the sensor 10 (step F40).

Conversely, if no AC component at the frequency $f_2$ is present in the voltage V3, it can then be deduced that the sensor 10 is behaving normally, in other words that it is not affected by a short circuit to mechanical ground (step F50).

It should be observed that in the above-described examples, the differential voltages V1, V2, and V3 established using the acquisition chain C1 are voltages that are established at the output from the filter 51. In known manner, after stabilization, the differential voltage established at the output of the filter 51 by the acquisition chain C1 is the image of the differential voltage at the input of the filter 51, in other words, after stabilization, it is the image of the differential voltage across the terminals of the sensor 10. The voltages V1, V2, and V3 established using the acquisition chain C1 are thus representative of the differential voltages across the terminals of the sensor 10.

The above examples are described for a differential mode acquisition chain. Nevertheless, as mentioned above, the invention also applies to a common mode acquisition chain.

Figure 6:
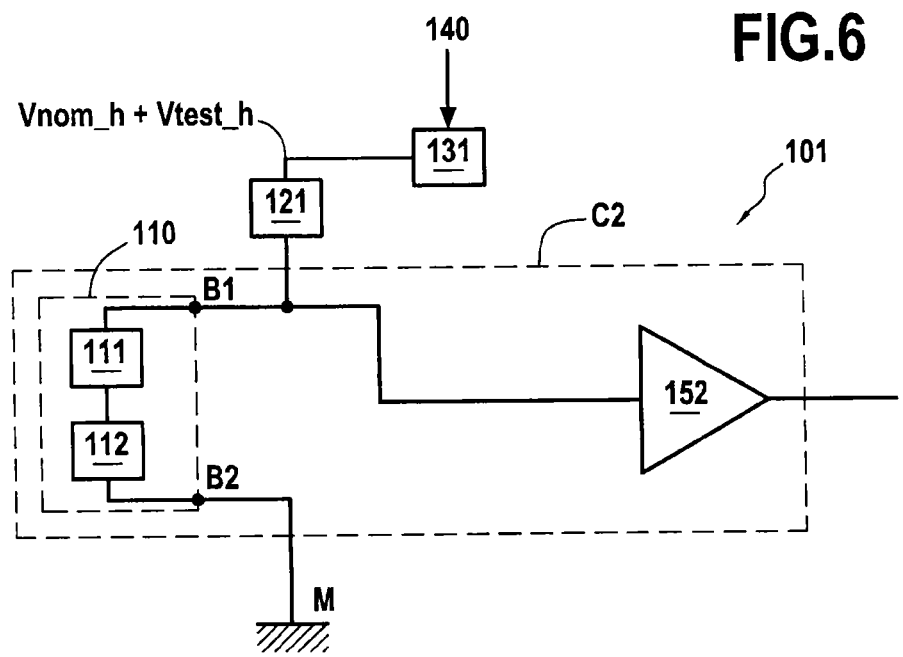
FIG. 6 shows a particular, common-mode embodiment of a detection system in accordance with the invention.

FIG. 6 shows a particular embodiment of the invention comprising a system 101 for detecting a short circuit affecting a sensor 110 of a common mode acquisition chain C2.

By way of example, the sensor 110 is an inductive sensor for sensing position or movement, and it comprises at least an inductive element 111 and a resistive element 112. These assumptions are naturally not limiting, it being possible in a variant for the sensor 110 to be a sensor that is resistive or capacitive, and that serves to detect other variables, such as temperature, pressure, speed, etc.

In common mode, one of the terminals B2 of the sensor 110 is connected to ground M, while the other terminal B1 is connected to a bias resistor 121.

The bias resistor 121 corresponds to a high potential level. It is connected to a digital-to-analog converter 131 suitable for varying its bias voltage. The digital-to-analog converter 131 is controlled by a digital core 140.

The acquisition chain C2 of the sensor 110 is also constituted, in conventional manner, by an amplifier 152 serving to improve the signal-to-noise ratio of the measurement signal delivered by the sensor 110.

Such a common mode acquisition chain C2 is often used when mechanical and electrical grounds are connected together. In this context, only one kind of short circuit can be encountered at the sensor 110, namely a differential short circuit. Thus, the system 101 may be used in a manner similar to the detection system 1 described above for detecting a differential short circuit when a differential mode chain is under consideration. Nevertheless, since the detection system 101 has only one bias voltage, the amplitude value of the applied test bias voltage Vtest_h needs to be twice as great as in the system 101 in order to enable a short circuit to be detected.

The invention is applied in preferred but non-limiting manner to the field of aviation. It serves in particular to detect short circuits that might affect the numerous sensors present on board an aircraft, such as for example sensors for sensing temperature, movement, pressure, etc.

Depending on the sensor under consideration and on its impedance, and also depending on the type of short circuit that it is desired to detect, it should be observed that the detection method and system of the invention may be used during a test while testing in flight or on the ground, or in a variant during a self-test, in particular when an AC voltage is injected in order to apply the test bias voltages.

The invention claimed is:

1. A method of detecting a short circuit affecting a sensor, at least one terminal of the sensor being connected to a bias resistor, the method comprising:
   applying to at least one bias resistor at least one test bias voltage having at least one predefined characteristic that is different from a corresponding characteristic of a nominal bias voltage of the at least one bias resistor;
   measuring a resulting differential voltage across terminals of the sensor; and
   as a function of at least one characteristic of the measured resulting differential voltage corresponding to the at least one predefined characteristic of the at least one test bias voltage, determining whether the sensor presents a short circuit,
   wherein it is determined that the sensor presents the short circuit if the at least one characteristic of the measured resulting differential voltage is different from an expected corresponding characteristic for a differential voltage measured across the terminals of the sensor when the sensor does not present the short circuit.

2. A method of detecting a short circuit according to claim 1, wherein:
   each terminal of the sensor is connected to a corresponding bias resistor;
   to apply the at least one test bias voltage to each of the at least one bias resistor, an AC signal at a predetermined frequency different from a working frequency of the sensor is applied to the at least one bias resistor; and
   it is determined that the sensor presents the short circuit if the measured resulting differential voltage includes an AC component at said predetermined frequency.

3. A method of detecting a short circuit according to claim 1, further comprising measuring a nominal differential voltage across the terminals of the sensor when the at least one bias resistor is fed with nominal bias voltages, and
   wherein it is determined that the sensor presents the short circuit if the measured resulting differential voltage after applying the at least one test bias voltage is substantially equal to the nominal differential voltage.

4. A method of detecting a short circuit according to claim 3, wherein to apply the at least one test bias voltage, a DC signal is applied to each of the at least one bias resistor.

5. A method of detecting a short circuit according to claim 4, wherein the DC signal has a first amplitude different from a second amplitude of the nominal bias voltage of the at least one bias resistor.

6. A method of detecting a short circuit according to claim 3, wherein to apply the at least one test bias voltage, an AC signal at a predetermined frequency different from a working frequency of the sensor is applied to each of the at least one bias resistor.

7. A method of detecting a short circuit according to claim 6, wherein each terminal of the sensor is connected to a corresponding bias resistor, and wherein, to apply the at least one test bias voltage, the AC signals applied to the at least one bias resistor are two sinusoidal signals in phase opposition.

8. A system for detecting a short circuit affecting a sensor, at least one terminal of the sensor being connected to a bias resistor, the system comprising:
- means for applying, to at least one bias resistor, a test bias voltage having at least one predefined characteristic different from a corresponding characteristic of a nominal bias voltage of the at least one bias resistor;
- means for measuring a resulting differential voltage across terminals of the sensor; and
- means for determining, as a function of at least one characteristic of the measured resulting differential voltage corresponding to the at least one predefined characteristic of the at least one test bias voltage, whether the sensor presents a short circuit,
- wherein it is determined that the sensor presents the short circuit if the at least one characteristic of the measured resulting differential voltage is different from an expected corresponding characteristic for a differential voltage measured across the terminals of the sensor when the sensor does not present the short circuit.

9. A system for detecting a short circuit according to claim 8, wherein the means for applying the at least one test bias voltage comprises a digital-to-analog converter.

* * * * *